United States Patent
Chimakurthy

(10) Patent No.: US 10,732,238 B2
(45) Date of Patent: Aug. 4, 2020

(54) DETERMINING FREQUENCY FOR ACHIEVING A HIGH SIGNAL-TO-NOISE RATIO IN LOW IMPEDANCE RECEIVERS

(71) Applicant: Halliburton Energy Services, Inc., Houston, TX (US)

(72) Inventor: Lakshmi Sri Jyothi Chimakurthy, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/560,929

(22) PCT Filed: Dec. 2, 2016

(86) PCT No.: PCT/US2016/064746
§ 371 (c)(1),
(2) Date: Sep. 22, 2017

(87) PCT Pub. No.: WO2018/101966
PCT Pub. Date: Jun. 7, 2018

(65) Prior Publication Data
US 2019/0277928 A1    Sep. 12, 2019

(51) Int. Cl.
| | |
|---|---|
| *G01R 33/46* | (2006.01) |
| *G01R 33/36* | (2006.01) |
| *G01R 33/58* | (2006.01) |
| *G01V 3/32* | (2006.01) |
| *G01N 24/08* | (2006.01) |
| *G01V 3/14* | (2006.01) |

(52) U.S. Cl.
CPC ....... *G01R 33/3607* (2013.01); *G01N 24/081* (2013.01); *G01R 33/3621* (2013.01); *G01R 33/3628* (2013.01); *G01R 33/583* (2013.01); *G01V 3/14* (2013.01); *G01V 3/32* (2013.01)

(58) Field of Classification Search
CPC ... G01R 33/3607; G01R 33/3628; G01V 3/32
USPC ........................................................ 324/307
See application file for complete search history.

(56) References Cited

U.S. PATENT DOCUMENTS

| | | | | |
|---|---|---|---|---|
| 5,814,988 | A * | 9/1998 | Itskovich | G01V 3/32 324/303 |
| 6,229,308 | B1 | 5/2001 | Freedman | |
| 2002/0036503 | A1* | 3/2002 | Toufaily | G01N 24/081 324/318 |
| 2002/0079977 | A1* | 6/2002 | Sakai | H03B 5/366 331/74 |
| 2005/0030037 | A1 | 2/2005 | Fanini et al. | |

(Continued)

*Primary Examiner* — Melissa J Koval
*Assistant Examiner* — Courtney G McDonnough
(74) *Attorney, Agent, or Firm* — John W. Wustenberg; Parker Justiss, P.C.

(57) ABSTRACT

A circuit, system and method for measuring the optimal frequency of transmission and reception for achieving the best possible signal-to-noise ratio (SNR) in low impedance receive systems are provided. In one embodiment, the circuit includes: (1) an antenna that transmits and receives radio-frequency (RF) signals, (2) a receive circuit that is connected to the antenna during a receive mode and a calibration mode, wherein the receive circuit includes an amplifier having a low input impedance, and (3) an impedance switching circuit that places the amplifier in a high input impedance state during the calibration mode.

18 Claims, 6 Drawing Sheets

(56) References Cited

U.S. PATENT DOCUMENTS

2005/0073357 A1     4/2005   Carpineto et al.
2012/0256634 A1   10/2012   Morys
2016/0251952 A1     9/2016   Tran et al.

* cited by examiner

DETERMINING FREQUENCY FOR ACHIEVING A HIGH SIGNAL-TO-NOISE RATIO IN LOW IMPEDANCE RECEIVERS

CROSS-REFERENCE TO RELATED APPLICATION

This application is the National Stage of, and therefore claims the benefit of, International Application No. PCT/US2016/064746 filed on Dec. 2, 2016, entitled "DETERMINING FREQUENCY FOR ACHIEVING A HIGH SIGNAL-TO-NOISE RATIO IN LOW IMPEDANCE RECEIVERS". The above application is commonly assigned with this National Stage application and is incorporated herein by reference in its entirety.

BACKGROUND

A transceiver includes an antenna that is used to transmit and receive radio frequency (RF) signals. The transceiver includes a receive circuit that is connected to the antenna when receiving the RF signals. The receive circuit typically amplifies the received signal from the antenna for further processing. In some applications, it is advantageous to have a receive circuit with an amplifier that has a low input impedance.

For example, current technologies for nuclear magnetic resonance (NMR) transceivers, sometimes referred to as NMR sensors, use the same antenna to generate high-energy RF excitation pulses and detect the echo signals induced by the high-energy RF excitation pulses. NMR transceivers, therefore, face the problem of decoupling a receive circuit driving a amplifier that receives the echo signal provided by the antenna from undesirable ringing effects produced by transient high voltage in the antenna after transmitting excitation pulses. To help dampen residual energy from the antenna after transmitting excitation pulses, an NMR transceiver may have a low input impedance pre-amplifier. Thus, a receiving amplifier with a low input impedance can assist in providing an ultra fast inter echo time (Te) between transmitted excitation pulses and received echo signals.

Though low input impedance receivers can prove advantageous, they also provide challenges. For example, the impedance of a low input impedance receiver loads a source antenna and flattens the frequency response of the source. This makes it difficult to measure the resonance frequency of the antenna. Determining the resonance frequency of the antenna is important since the source antenna resonance frequency is often the frequency at which the best noise performance of a transceiver or transceiver system is achieved. In conventional NMR transceivers, this resonance frequency is typically measured in a receive mode of the transceiver and energy is then transmitted at this frequency in the transmit mode.

BRIEF DESCRIPTION

Reference is now made to the following descriptions taken in conjunction with the accompanying drawings, in which.

DETAILED DESCRIPTION

Figure 1:
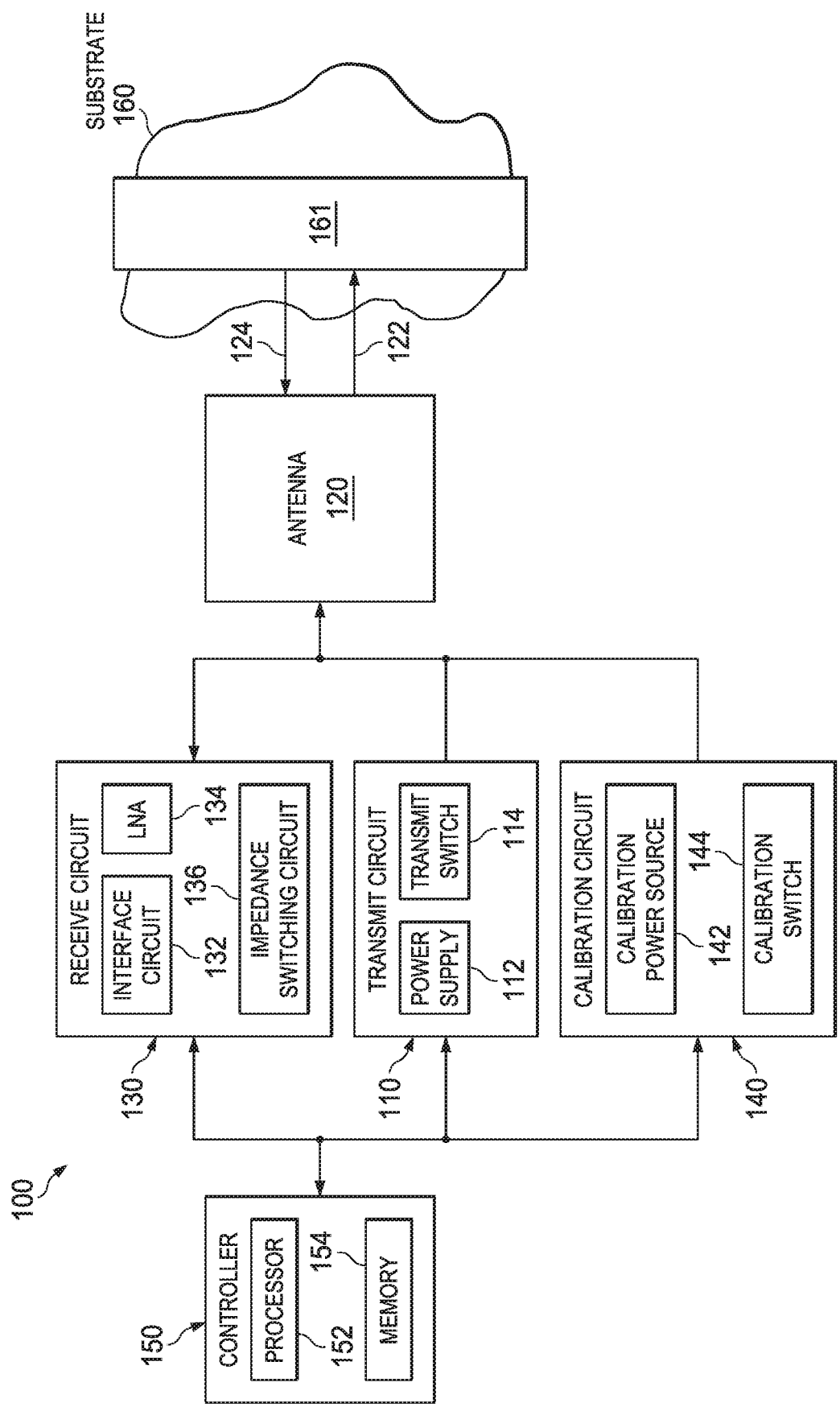
FIG. 1 illustrates a block diagram of a nuclear magnetic resonance (NMR) transceiver.

The frequency of reception at which a transceiver can achieve the best or highest signal-to-noise ratio (SNR) is usually the resonance frequency of the source (resonance frequency of source antenna). The resonance of the source will also include the parasitics due to wiring harness and interface circuits. Determining the resonance frequency of a transceiver is difficult when the input impedance of a receiver loads the source. In fact, the resonance frequency of the system measured through the receiver is different from the resonance frequency of just the source as the input impedance of the receiver loads the source. As the frequency response of the system is relatively flat in low impedance transceiver systems, any variation in the gain of the receiver over frequency can result in an inaccurate resonance frequency measurement.

In a typical transceiver there will be parasitic loading across the antenna due to wiring, parasitics of protection circuitry, and interface modules between the antenna and the receiver. The true resonance of the source will be detuned due to this parasitic loading. The frequency at which the best noise performance will be achieved is the frequency which includes the parasitic loading on the source but not the input impedance of the receiver. To obtain the best noise performance out of a transceiver, the resonance of the source should be accurately measured to include any parasitics before connecting to the receiver. Additionally, if the receiver input impedance is very low when compared to the antenna source impedance, it will load it heavily, flatten the Q of the system and make it difficult to measure the resonance of the antenna through the receiver.

Some conventional transceivers having low input impedance amplifiers, such as some NMR transceivers, measure the resonance of a source through the receiver during a receive mode and add a correction factor to the frequency measured. As such, there is no direct measurement made to measure the true resonance of the source. In some multi-frequency tools, a set of correction factors corresponding to a set of frequencies are stored and used to determine the optimum receive/transmit frequency. The SNR achieved in these types of tools will then depend on the accuracy of the correction factor which is not ideal. Additionally, the correction factor has to be determined separately on each transceiver tool to be accurate as the parasitics may vary between the different transceiver tools.

As such, the disclosure provides a circuit, a system and method to make a real time, direct measurement of the optimum receive frequency of a transceiver that considers and improves the accuracy with respect to temperature variations, parasitic variations, and different resonance frequencies of the source. As disclosed herein the actual resonance frequency of a source (e.g., an antenna) is determined through a receiver of a transceiver, for example NMR transceiver, in a non-receiving mode. The non-receiving mode can be a calibration mode of the transceiver.

FIG. 1 illustrates a block diagram of a nuclear magnetic resonance (NMR) transceiver 100. The NMR transceiver 100 is an example of a transceiver having a low input impedance receiver. The NMR transceiver 100 may include a transmit circuit 110, an antenna 120, a receive circuit 130, a calibration circuit 140, and a controller 150. The NMR transceiver 100 may include additional components that are not illustrated or discussed herein that are typically included in a NMR transceiver, sensor, or tool. For example, the transmit circuit 110 and the receive circuit 120 may include additional circuitry for processing signals than is illustrated in FIG. 1. The NMR transceiver 100 is shown in an environment with a substrate 160.

The transmit circuit 110 generates signals for transmission via the antenna 120 and the receive circuit 130 processes signals that are received from the antenna 120. The transmit circuit 110 includes a power supply 112 and a transmit switch 114. The power supply 112 is coupled to the antenna when the transmit switch 114 is closed and is configured to provide high voltage pulses to the antenna to transmit RF excitation pulses through the substrate 160. Operation of the transmit switch 114 may be controlled via a control signal, such as a transmit control signal. The controller 150 may generate a transmit control signal to close the transmit switch 114 when the NMR transceiver 100 is in a transmit mode.

The antenna 120 may be a resonant antenna that is configured to transmit and receive RF signals. The antenna 120 may be a conventional antenna that is used with NMR transceivers such as a downhole NMR sensor. The antenna 120 can be controllably coupled to the transmit circuit 110 and the receive circuit 130 via switches.

The receive circuit 130 includes an interface circuit 132, a Low-Noise Amplifier (LNA) 134, and an impedance switching circuit 136. The interface circuit 132 may include a gate driver for the LNA 134 and interface switches that connect the LNA 134 to the antenna 120. Operation of the interface switches may be controlled via a control signal, such as a receive control signal. The controller 150 may generate a receive control signal to close the interface switches for a receive mode of the NMR transceiver 100. The interface switches may also be closed by a calibration control signal generated by the controller 150.

The LNA 134 receives a signal from the antenna via the interface circuit 132, amplifies the received signal by a gain of the LNA 134, and provides the amplified signal at an output of the LNA 134. The amplified output signal can then be further processed. For example, the amplified signal can be measured at the LNA 134 output via an analog to digital converter for further processing by the controller 150. The LNA 134 is a low input impedance LNA. A low input impedance is an impedance in the order of less than 100 ohms, wherein a high input impedance would be in the order of a few hundred ohms to kilo ohms.

The impedance switching circuit 136 is configured to place the LNA 134 in a high input impedance state when determining a resonance frequency of the antenna 120. The impedance switching circuit 136 may include an impedance switch that is open during the calibration mode to place the LNA 134 in a high impedance state. During receive mode, the impedance switch is closed. Operation of the impedance switch may be controlled via a control signal, such as a calibration control signal generated by the controller 150. The controller 150 may generate the calibration control signal for a calibration mode of the NMR transceiver 100.

The NMR transceiver 100 also includes a calibration circuit 140 that is configured to apply a calibration voltage to the antenna 120 for calibration of the NMR transceiver 100. The calibration circuit 140 includes a calibration power source 142 and a calibration switch 144. The calibration power source 142 generates a known reference voltage that is provided to the antenna 120 when the calibration switch 144 is closed. Operation of the calibration switch 144 may be controlled via the calibration control signal generated and sent by the controller 150 for a calibration mode.

The controller 150 includes a processor 152 and a memory 154. In some embodiments, the memory 154 is configured to store commands which, when executed by the processor 152 cause the controller 150 to perform steps consistent with methods as disclosed herein. In some embodiments, the controller 150 may be a computer or a microprocessor.

Three different operating modes for the transceiver 100 are noted in the above discussion. In the transmit mode, the antenna 120 receives power from the power supply 112 to transmit an RF excitation pulse 122. The excitation pulse 122 propagates through the substrate 160 surrounding the NMR transceiver 100. The substrate 160 may comprise, for example, a subterranean formation penetrated by a wellbore and the NMR transceiver 100 may be lowered within the wellbore until locating the subterranean formation. A portion 161, or 'shell', of the substrate 160 may send an echo signal 124 back to antenna 120 in response to the excitation pulse 122. The echo signal 124 may provide useful information of materials forming part of or otherwise within the portion 161 of the substrate 160, and their physical condition (e.g., viscosity, density, physical phase—liquid, gas, or solid—and the like).

In a receive mode, the antenna 120 receives echo signal 124 after a selected period of time from transmitting excitation pulse 122. When the antenna 120 is set in a receive mode, the LNA 134 is configured to receive and amplify the echo signal 124 from the antenna 120. The LNA 134 relays the amplified signal to the controller 150 for processing. The controller 150 may use the processor 152 to determine a characteristic of the substrate based on the received RF signal in the echo signal 124. In some embodiments, the inter echo time (Te) between two consecutive transmitted excitation pulses could be ultra fast, such as at 200 microseconds. The NMR transceiver 100 may operate over a broad frequency range, such as between 400 kHz to 2 MHz. Advantageously, the NMR transceiver 100 may operate with the inter echo time of 200 microseconds across the 400 kHz to 2 MHz range.

As noted above, in the calibration mode the NMR transceiver 100 employs the calibration circuit 140 for calibration. Additionally, in contrast to conventional NMR transceivers, the NMR transceiver 100 is also configured to determine the resonance frequency of the antenna 120 in calibration mode. The NMR transceiver 100 advantageously employs the calibration control signal to control operation of the impedance switching circuit 136 during a calibration mode to place the LNA 132 in a high impedance state. Thus, the low input impedance of the LNA 132 does not negatively influence the measurement of the resonance frequency of the antenna 120 during the calibration mode.

Figure 2:
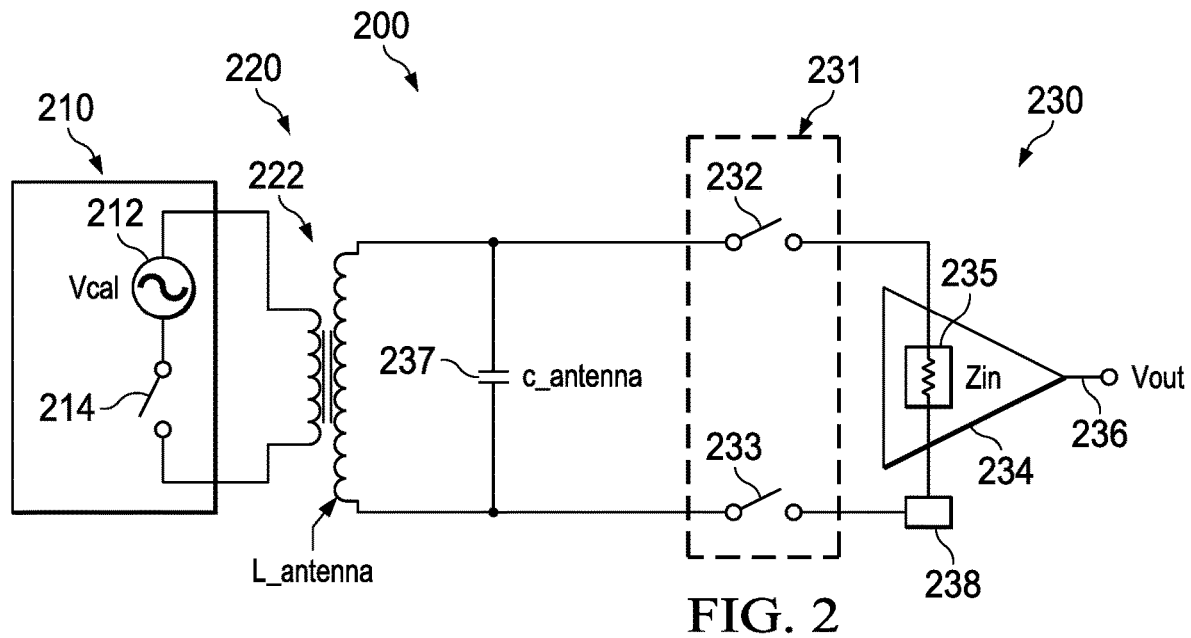
FIG. 2 illustrates a schematic diagram of a transceiver having a low input impedance receiver.

FIG. 2 illustrates a schematic diagram of a transceiver 200 having a low input impedance receiver. The transceiver 200 may be an NMR transceiver such as, for example, the NMR transceiver 100 of FIG. 1. The transceiver 200 includes a calibration circuit 210, an antenna 220, and a receive circuit 230. The transceiver 200 may include additional circuitry that is not illustrated, such as a transmit circuit. Capacitance of the antenna 220 is represented by element 237. The receive circuit 230 includes an interface circuit 231, an amplifier 234, and an impedance switching circuit 238.

The calibration circuit 210 employs a power source to provide a calibration voltage to the antenna 220. The calibration circuit 210 includes a calibration power source 212 that generates a known reference voltage, reference calibration voltage Vcal, and a calibration switch 214. When the calibration switch 214 is closed in a calibration mode, the reference calibration voltage Vcal is injected across antenna 220 due to a weak coupling between the coils 222 of the antenna 220. The calibration switch 214 may be controlled by a calibration control signal. The reference calibration voltage Vcal applied across the antenna 220 is fed into the receive circuit 230 by closing interface switches 232, 233, and is amplified by the receiver gain of the amplifier 234. The amplified output signal is then provided at an output 236 of the amplifier 234. The amplified output signal may be measured through an ADC connected thereto.

The amplified version of the reference calibration voltage Vcal can be measured at the output 236 of the amplifier 234 over a wide frequency range to determine the resonance frequency point. The amplifier 234, which can be a LNA, has a low input impedance 235. When the reference voltage Vcal is passed through a low input impedance LNA/pre-amplifier, such as the amplifier 234, the frequency response of the input thereof is not the same as the frequency response of the output. Instead, the amplified signal at the output is highly attenuated and flattened for a low input impedance LNA/pre-amplifier. The flatness of the frequency response at the output makes it difficult to measure the resonance point.

As stated above, the amplifier 234, which can be a LNA, has a low input impedance 235. During the calibration mode, however, the amplifier 234 is placed in a high input impedance state via the impedance switching circuit 238. As such, the frequency response passed through the input of amplifier 234 is essentially the same as the frequency response that is measured at the output 236. The impedance switching circuit 238 may place the amplifier 234 in a high impedance state by opening a switch between the amplifier 234 and a supply voltage, such as Vss or ground. More details of an impedance switching circuit are provided in FIG. 3.

Figure 3:
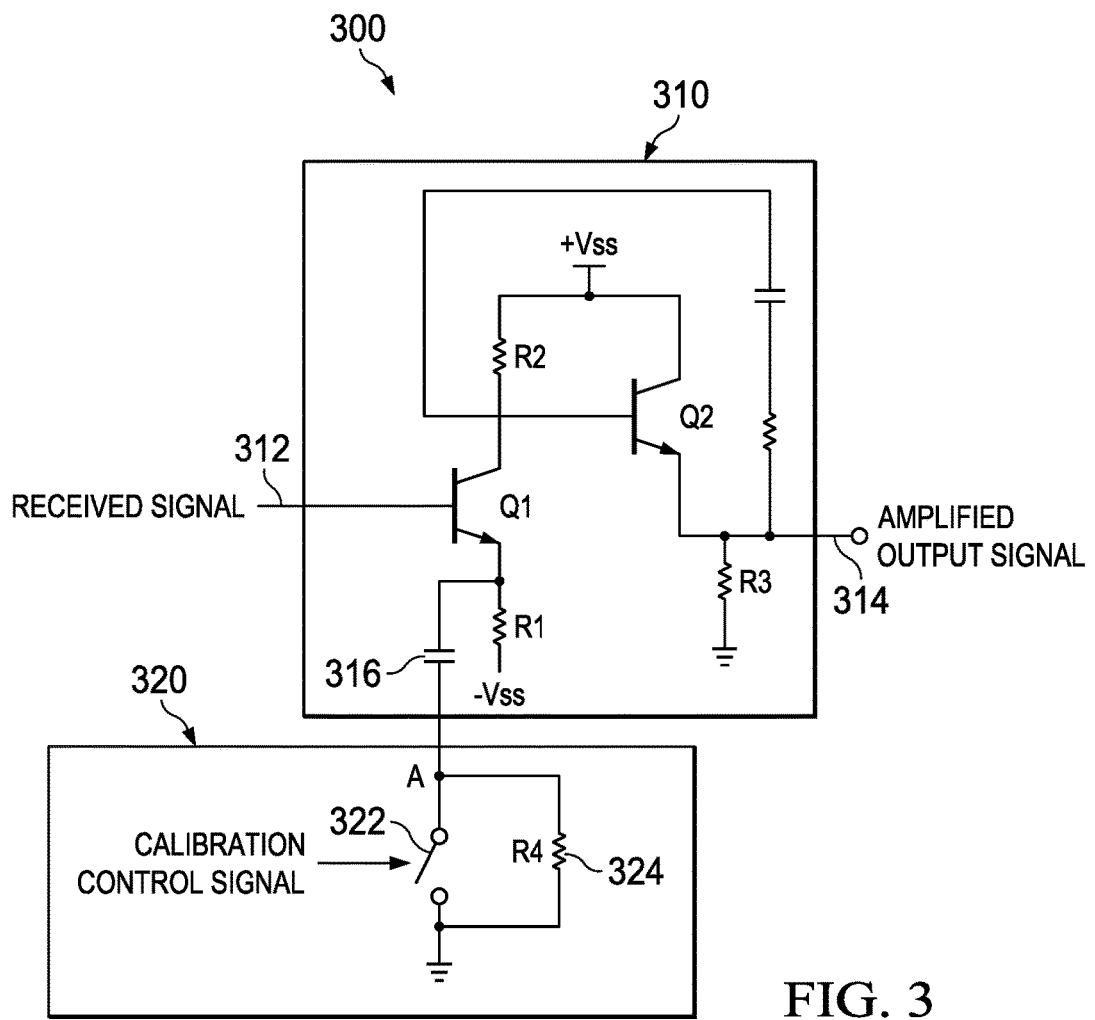
FIG. 3 illustrates a schematic diagram of a receive circuit having a low input impedance receiver and an impedance switching circuit.

FIG. 3 illustrates a schematic diagram of a receive circuit 300 having a low input impedance receiver 310 and an impedance switching circuit 320. The low input impedance receiver 310 may be a conventional low input impedance receiver. In FIG. 3, the receiver 310 is illustrated as a conventional LNA having a common emitter with shunt feedback as illustrated. An input 312, an output 314, and a shorting capacitor 316 of the receiver 310 are identified in FIG. 3. The receiver 310 may be the LNA 134 or the amplifier 234 illustrated in FIG. 1 and FIG. 2, respectively. Node A identified in FIG. 3 corresponds to Node A identified in FIG. 4. The operating voltage Vss may be five volts.

The impedance switching circuit 320 is configured to place the receiver 310 in a high impedance state during a calibration mode. The impedance switching circuit 320 includes an impedance switch 322 and a protection resistor 324. The impedance switch is controlled by a calibration control signal that opens the impedance switch 322 during a calibration mode. A controller, such as controller 150 of FIG. 1 may generate the calibration control signal. In other operating modes, such as a receive mode, the impedance switch 322 is closed. The protection resistor 324 is positioned in parallel to the impedance switch 322 and prevents the shorting capacitor 316 of the receiver 310 from floating when the impedance switch is open. The value of the protection resistor can be based on the design of the impedance switching circuit 320. The protection resistor 324 may have a value of 10,000 ohms.

The impedance switching circuit 320 is a variable circuit that is configured such that the low impedance amplifier 310 is stable when the shorting capacitor 316 is open or shorted. The impedance switching circuit 320 is also configured to add minimum noise when the impedance switch 322 is closed, such as during the receive mode. More details of an impedance switching circuit are provided with respect to FIG. 4.

Figure 4:
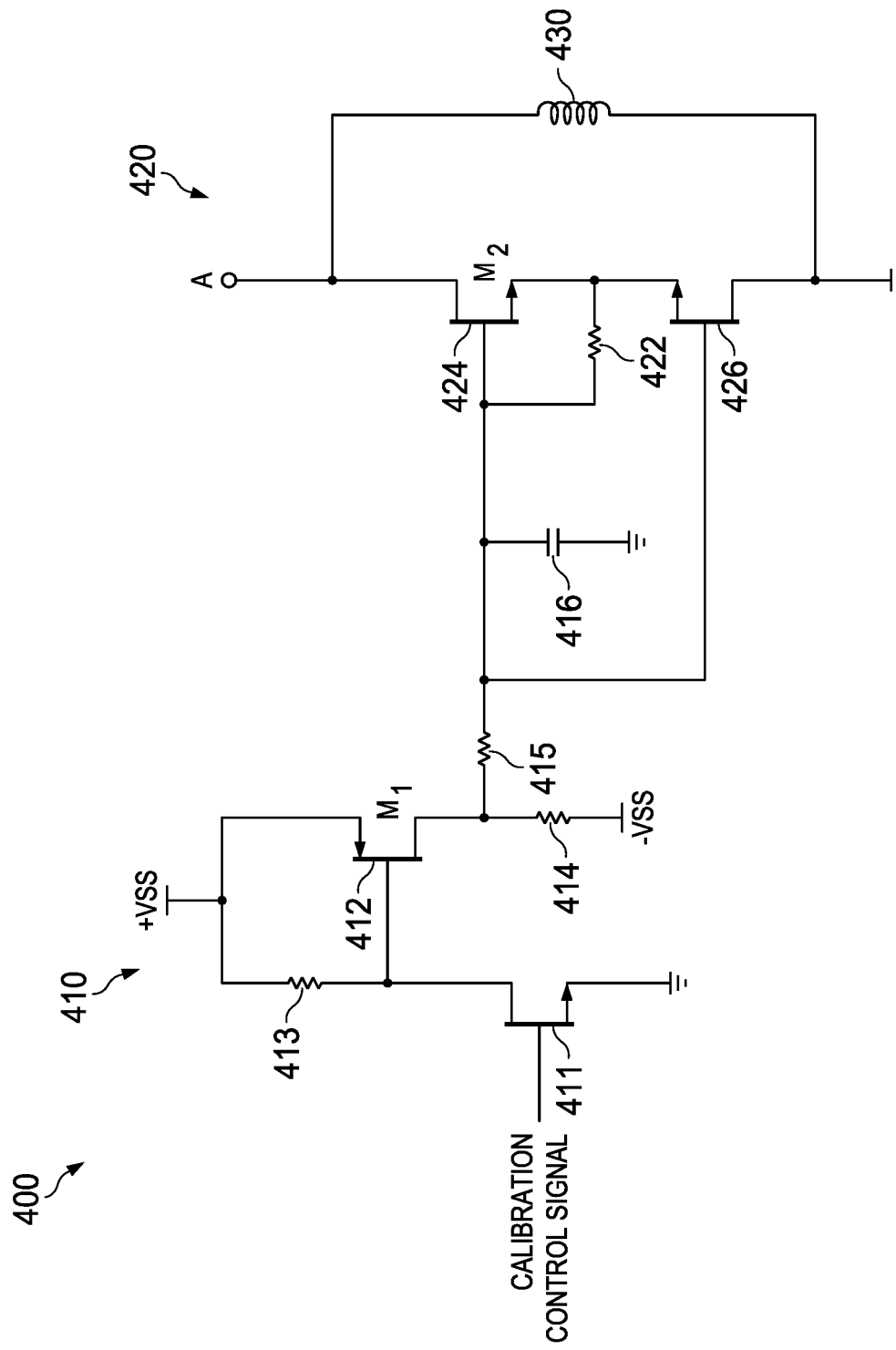
FIG. 4 illustrates a schematic diagram of an impedance switching circuit.

FIG. 4 illustrates an impedance switching circuit 400. The impedance switching circuit 400 includes a driving circuit 410 and an impedance switch 420. The impedance switching circuit 400 may also include a protection resistor 430, such as the protection resistor 324, depending on, for example, with which particular receiver the impedance switching circuit 400 is employed and the configuration of the impedance switching circuit. The driving circuit 410 controls operation of the impedance switch 420. The driver circuit 410 is designed to limit the amount of noise that is added to a receiver or receive circuit such as receive circuit 130, receive circuit 230, or low input impedance receiver 310. The driver circuit 410 includes a control switch 411 that receives and is controlled by a calibration control signal. A controller, such as controller 150, can generate and send the calibration control signal. The control switch 411 operates hold switch 412. Hold switch 412 assists in keeping impedance switch 420 completely on and in quickly applying Vss or applying Vss hard to maintain a low impedance for the impedance switching circuit 400. The operating voltage Vss may be five volts. Typically, hold switch 412 is a low impedance switch.

Up resistor 413 is positioned and sized to pull up hold switch 412 when control switch 411 is off. Down resistor 414 is positioned and sized to pull down hold switch 412 when in calibration mode.

Resistor 415 and capacitor 416 are positioned and sized to influence the calibration time. The values of the resistor 415 and the capacitor 416 are chosen to meet the operating speed requirement of the impedance switch 420.

Impedance switch 420 includes a middle resistor 422 and two switches 424, 426. The middle resistor 422 is positioned and sized to keep the midpoint between the switches 424, 426, from floating.

Figure 5:
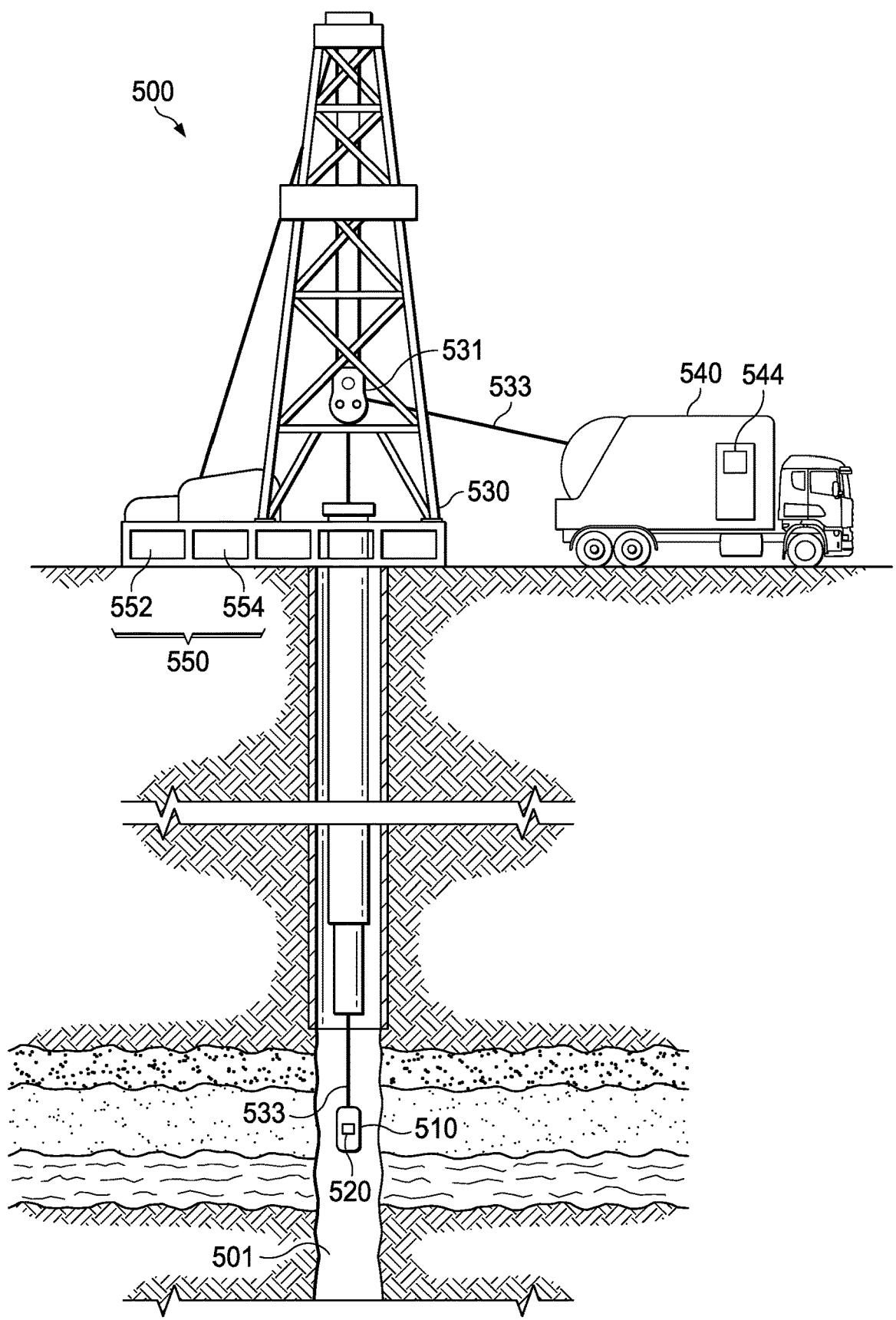
FIG. 5 illustrates a system diagram of a wireline system configured to use a NMR transceiver during formation testing and sampling.

FIG. 5 illustrates a wireline system 500 configured to use an NMR transceiver during formation testing and sampling. After drilling of a wellbore 501 is complete, it may be desirable to know more details of types of formation fluids and the associated characteristics through sampling with use of a wireline formation tester.

Wireline system 500 may include a wireline tool 510 that forms part of a wireline logging operation that can include at least one NMR transceiver 520, such as or at least similar to the NMR transceiver 100 of FIG. 1, as part of a downhole measurement tool. Wireline system 500 may include a derrick 530 that supports a traveling block 531, and the wireline tool 510, such as a probe or a sonde, may be lowered by a conveyance e 533 into a borehole 501. A conveyance can be a wireline, logging cable, a slickline, coiled tubing, a pipe, a tractor, etc. The wireline tool 510 may be lowered to the bottom of the region of interest and subsequently pulled upward at a substantially constant speed. The wireline tool 510 may be configured to measure fluid properties of the wellbore fluids, and any measurement data generated by wireline tool 510 and the one or more NMR transceiver 520 can be communicated to a surface logging facility 540 for storage, processing, and/or analysis. In some embodiments, the wireline tool 510 is configured to measure properties of a substrate surrounding borehole 501, as disclosed herein.

Logging facility 540 may be provided with electronic equipment 544, including processors for various types of signal processing. Wireline system 500 may further include a controller 550 having a processor 552 and a memory 554. Controller 550, processor 552, and memory 554 may be similar to controller 150, processor 152, and memory 154, described in FIG. 1. Accordingly, memory 554 is configured to store commands which, when executed by processor 552 cause controller 550 to perform steps consistent with methods as disclosed herein, such as in FIG. 7.

Figure 6:
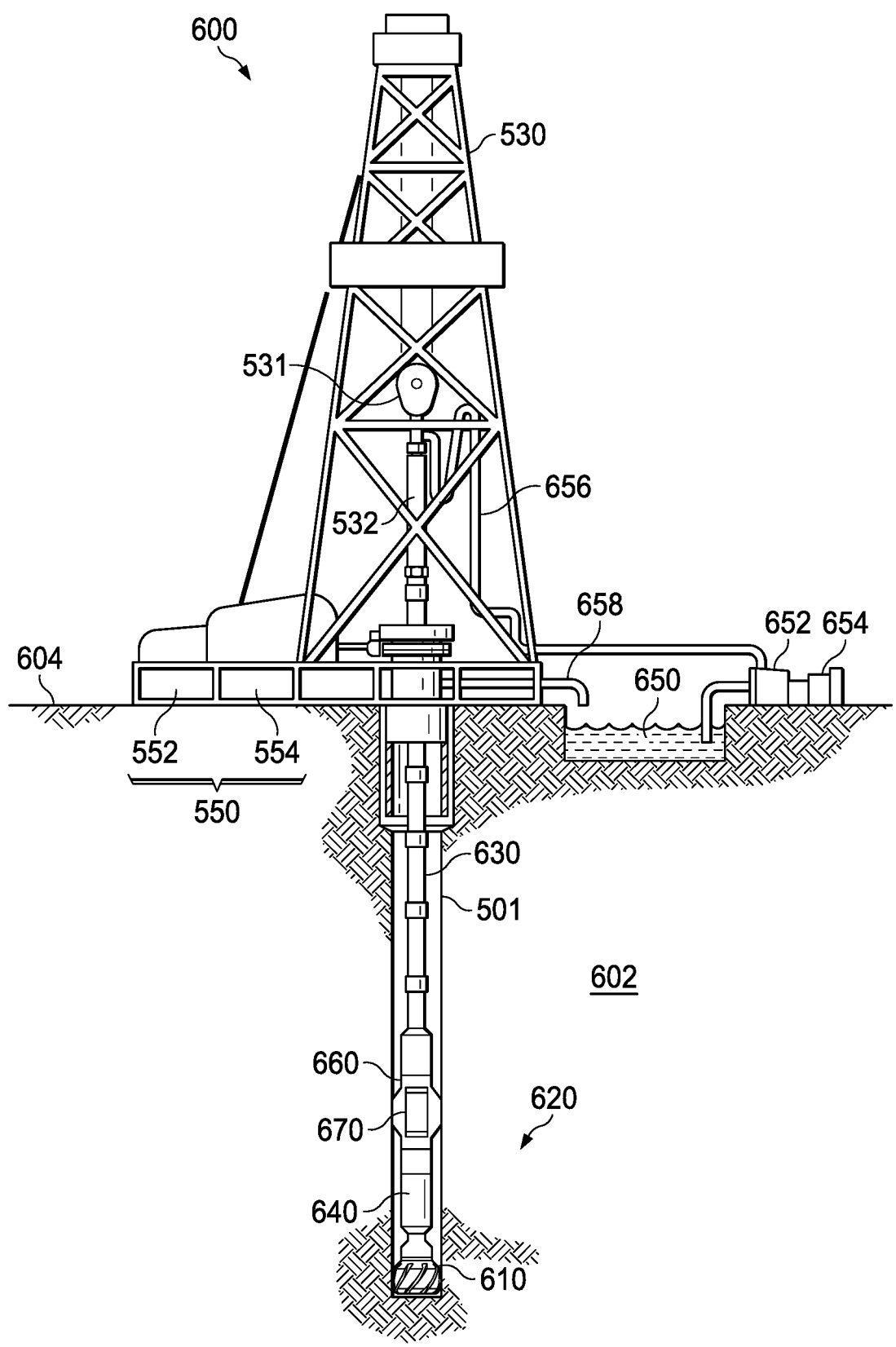
FIG. 6 illustrates a system diagram of a logging while drilling (LWD) system configured to use an NMR transceiver during formation drilling.

FIG. 6 illustrates a logging while drilling (LWD) system 600 configured to use an NMR transceiver during formation drilling. Borehole 501 may be created by drilling into the earth 602 using drilling tool. LWD system 600 may be configured to drive bottom hole assembly (BHA) 620 positioned or otherwise arranged at the bottom of a drill string 630 extended into the earth 602 from derrick 530 arranged at the surface 604. Derrick 530 includes a kelly 532 and a traveling block 531 used to lower and raise the kelly 532 and drill string 630.

BHA 620 may include a drill tool 610 operatively coupled to a tool string 640 which may be moved axially within wellbore 501 as attached to the tool string 640. During operation, drill tool 610 penetrates the earth 602 and thereby creates wellbore 501. BHA 620 provides directional control of drill tool 610 as it advances into earth 602. Tool string 640 can be semi-permanently mounted with various measurement tools (not shown) such as, but not limited to, measurement-while-drilling (MWD) and logging-while-drilling (LWD) tools, that may be configured to take downhole measurements of drilling conditions. In other embodiments, the measurement tools may be self-contained within drill string 630.

Fluid or "drilling mud" from a mud tank 650 may be pumped downhole using a mud pump 652 powered by an adjacent power source, such as a prime mover or motor 654. The drilling mud may be pumped from mud tank 650, through a stand pipe 656, which feeds the drilling mud into drill string 630 and conveys the same to drill tool 610. The drilling mud exits one or more nozzles arranged in drill tool 610 and in the process cools drill tool 610. After exiting drill tool 610, the mud circulates back to the surface 604 via the annulus defined between the wellbore 501 and the drill string 630, and in the process, returns drill cuttings and debris to the surface. The cuttings and mud mixture are passed through a flow line 658 and are processed such that a cleaned mud is returned down hole through the stand pipe 656 once again. BHA 620 may further include an LWD tool 660. LWD tool 660 may include a sensor that incorporates the use of a NMR transceiver 670, such as described herein; for example, the NMR transceiver 520. LWD tool 660 may be positioned between drill string 630 and drill tool 610.

A controller 550 including a processor 552 and a memory 554 is communicatively coupled to NMR transceiver 670 in LWD tool 660. While NMR transceiver 670 may be placed at the bottom of wellbore 501, and extend for a few inches, a communication channel may be established by using electrical signals or mud pulse telemetry for most of the length of tool string 630 from drill tool 610 to controller 550. Memory 554 includes commands which, when executed by processor 552 cause controller 550 to perform steps in methods consistent with the present disclosure. More specifically, controller 550 may provide commands to and receive data from NMR transceiver 670 during operation. For example, in some embodiments, controller 550 may receive information from NMR transceiver 670 about drilling conditions in wellbore 501 and controller 550 may provide a command to BHA 620 to modify certain drilling parameters. For example, controller 550 may provide a command to adjust or change the drilling direction of drill tool 610 based on a message contained in information provided by NMR transceiver 670. In that regard, the information provided by NMR transceiver 670 to controller 550 may include certain drilling conditions such as physical or chemical properties of the drilling mud in the subterranean environment.

Accordingly, controller 550 may use processor 552 to determine a characteristic of the sample in a medium surrounding drill tool 610 using the data collected from NMR transceiver 670. Wireline tool 510 and LWD tool 660 may be referred to as a downhole tool.

Figure 7:
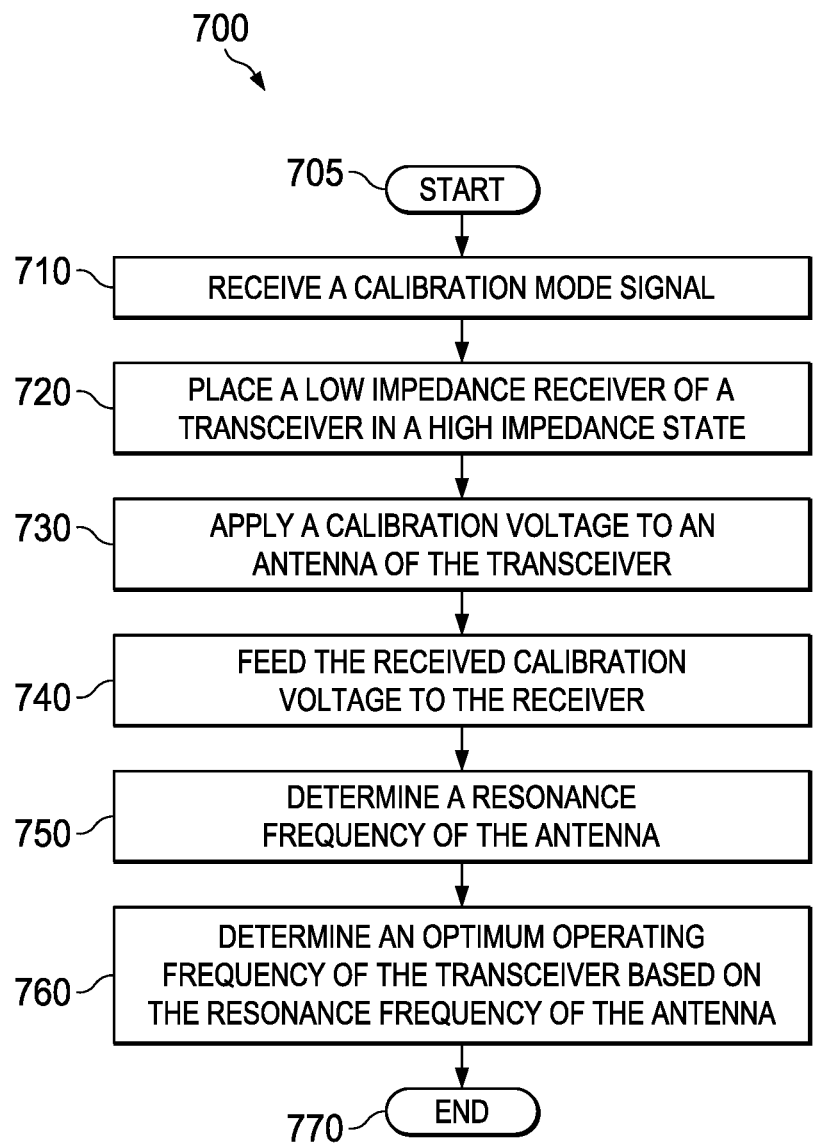
FIG. 7 illustrates a flow diagram of a method of operating a low impedance receiver.

FIG. 7 illustrates a flow diagram of an embodiment of a method 700 of operating a transceiver having a low impedance receiver. The transceiver may be a NMR transceiver such as described herein. For example, the transceiver may be the NMR transceiver 100, 200, 300, 520, or 670. The method 700 begins in a step 705.

In a step 710, a calibration mode signal is received by the transceiver. The calibration mode signal may be generated and sent by a controller of the transceiver, such as controller 150 described above with respect to FIG. 1. An interface circuit and an impedance switching circuit of the transceiver may receive the calibration mode signal.

The receiver of the transceiver is placed in a high impedance state in a step 720. The receiver may be temporarily placed a high impedance state based on the calibration mode signal. For example, the input impedance of a low input impedance receiver, or an amplifier such as an LNA of the receiver, can be temporarily changed to a high impedance during a calibration mode. The low impedance receiver may be placed in the high impedance state by opening an impedance switch of the impedance switching circuit coupled to the low impedance receiver.

In a step 730, a calibration voltage is applied to an antenna of the transceiver. The calibration voltage is a known reference voltage that is used to calibrate the transceiver for operating. The calibration voltage can be applied as done in conventional transceivers that employ a calibration mode.

The calibration voltage across the antenna is fed to the receiver in a step 740. The interface circuit can include switches that are closed to feed the received signal from the antenna, i.e., the calibration voltage, to the receiver. The calibration control signal can operate the switches of the interface circuit.

A resonance frequency of the antenna is determined in a step 750. The resonance frequency is determined during the application of the calibration voltage. Thus, the resonance frequency of the antenna can be determined in real time during a calibration mode of the transceiver. The resonance frequency of the antenna can be measured at an output of the low input impedance receiver and include a source resonance of the antenna, and parasitics of the transceiver between the antenna and the low input impedance receiver that has been placed in a high input impedance state.

In a step 760, an optimum operating frequency of the transceiver is determined based on the resonance frequency of the antenna. The optimum operating frequency is the frequency of reception at which the transceiver can achieve the best SNR. The optimum operating frequency may be the resonance frequency of the antenna as determined in step 750. The transceiver can then be operated at the optimum operating frequency to achieve a high SNR; even in harsh environments such as described with respect to FIG. 5 and FIG. 6. The method 700 ends in a step 770.

While the methods disclosed herein have been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

The above-described system and methods or at least a portion thereof may be embodied in or performed by various processors, such as digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods or functions of the system described herein.

Certain embodiments disclosed herein may further relate to computer storage products with a non-transitory computer-readable medium that have program code thereon for performing various computer-implemented operations that embody at least part of the apparatuses, the systems or carry out or direct at least some of the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

Embodiments disclosed herein include:

A. A circuit, including an antenna that transmits and receives radio-frequency (RF) signals, a receive circuit that is connected to the antenna during a receive mode and a calibration mode, wherein the receive circuit includes an amplifier having a low input impedance, and an impedance switching circuit that places the amplifier in a high input impedance state during the calibration mode.

B. A method of operating a transceiver having a low impedance receiver, including placing a low impedance receiver of a transceiver in a high impedance state, applying a calibration voltage to an antenna of the transceiver, and determining a resonance frequency of the antenna during the applying.

C. A nuclear magnetic resonance (NMR) transceiver, including an antenna configured to transmit and receive radio-frequency (RF) signals, a power supply coupled to the antenna and configured to provide high voltage pulses to the antenna to transmit RF excitation pulses, a receive circuit including a low noise amplifier (LNA) that has a low input impedance; and an impedance switching circuit configured to place the LNA in a high input impedance state when determining a resonance frequency of the antenna.

Each of embodiments A, B, and C may have one or more of the following additional elements in combination:

Element 1: wherein the impedance switching circuit includes an impedance switch and gate drive circuitry for the impedance switch. Element 2: wherein the impedance switching circuit is controlled by a calibration control signal. Element 3: wherein the amplifier is a low noise amplifier (LNA) and the impedance switching circuit is electrically coupled between a shorting capacitor of the LNA and ground. Element 4: wherein the impedance switching circuit includes a protection resistor coupled in parallel to the impedance switch. Element 5: wherein the impedance switch is open during the calibration mode and closed during the receive mode based on a calibration control signal. Element 6: an interface circuit that electrically couples the amplifier to the antenna during the receive mode and the calibration mode. Element 7: receiving a calibration control signal and placing the low impedance receiver in the high impedance state based on the calibration control signal. Element 8: wherein placing the low impedance receiver in the high impedance state includes opening an impedance switch coupled to the low impedance receiver. Element 9: wherein determining the resonance frequency of the antenna is performed in real time during a calibration mode of the transceiver. Element 10: determining an optimum operating frequency of the transceiver based on the resonance frequency of the antenna. Element 11: wherein the resonance frequency of the antenna includes a source resonance of the antenna and parasitics of the transceiver between the antenna and the low impedance receiver. Element 12: wherein determining the resonance frequency of the antenna includes measuring the resonance frequency of the antenna at an output of the low impedance receiver. Element 13: wherein the receive circuit further includes an interface circuit that couples the LNA to the antenna during a receive mode and a calibration mode of the NMR transceiver. Element 14: wherein the antenna receives echo signals from the excitation pulses during a receive mode of the NMR transceiver. Element 15: a controller configured to generate controls signals to operate the NMR transceiver in a calibration mode, a receive mode and a transmit mode. Element 16: wherein said impedance switching circuit is coupled between a shorting capacitor of the LNA and ground. Element 17: wherein an operating range of the NMR transceiver is between 400 kHz and 2 MHz.

What is claimed is:

1. A transceiver having a low input impedance receiver, comprising:
    an antenna that transmits and receives radio-frequency (RF) signals;
    a receive circuit that is connected to the antenna during a receive mode and a calibration mode, wherein the receive circuit includes an amplifier having a low input impedance; and
    an impedance switching circuit, coupled to a component of the amplifier, that places the amplifier in a high input impedance state during the calibration mode and is employable with the antenna to determine a resonance frequency of the antenna during the high impedance state, wherein the impedance switching circuit includes a protection resistor coupled in parallel to an impedance switch.

2. The transceiver as recited in claim 1 wherein the impedance switching circuit includes a gate drive circuitry for the impedance switch.

3. The transceiver as recited in claim 1 wherein the impedance switching circuit is controlled by a calibration control signal.

4. The transceiver as recited in claim 2 wherein the impedance switch is open during the calibration mode and closed during the receive mode based on a calibration control signal.

5. The transceiver as recited in claim 1, wherein the amplifier is a low noise amplifier (LNA) and the impedance switching circuit is electrically coupled between a shorting capacitor of the LNA and ground.

6. The transceiver as recited in claim 1, further comprising an interface circuit that electrically couples the amplifier to the antenna during the receive mode and the calibration mode.

7. A method of operating a transceiver having a low impedance receiver, comprising:
    placing, during a calibration mode, a low impedance receiver of a transceiver in a high impedance state, wherein the placing in the high impedance state includes opening an impedance switch coupled to a component of the low impedance receiver;
    applying a calibration voltage to an antenna of the transceiver;
    determining a resonance frequency of the antenna during the applying of the calibration voltage; and
    placing, during a sensing mode, the low impedance receiver of the transceiver in a low impedance state, wherein the low impedance receiver employs the resonance frequency of the antenna determined during the applying of the calibration voltage.

8. The method as recited in claim 7 further comprising receiving a calibration control signal and placing the low impedance receiver in the high impedance state based on the calibration control signal.

9. The method as recited in claim 7, wherein determining the resonance frequency of the antenna is performed in real time during the calibration mode of the transceiver.

10. The method as recited in claim 8, further comprising determining an optimum operating frequency of the transceiver based on the resonance frequency of the antenna.

11. The method as recited in claim 7, wherein the resonance frequency of the antenna includes a source resonance of the antenna and parasitics of the transceiver between the antenna and the low impedance receiver.

12. The method as recited in claim 7, wherein determining the resonance frequency of the antenna includes measuring the resonance frequency of the antenna at an output of the low impedance receiver.

13. A nuclear magnetic resonance (NMR) transceiver; comprising:
    an antenna configured to transmit and receive radio-frequency (RF) signals;
    a power supply coupled to the antenna and configured to provide high voltage pulses to the antenna to transmit RF excitation pulses;
    a receive circuit including a low noise amplifier (LNA) that has a low input impedance that is connected to the antenna during a receive mode and a calibration mode, wherein the receive circuit includes an amplifier having a low input impedance; and
    an impedance switching circuit, coupled to a component of the LNA, configured to place the LNA in a high input impedance state when determining a resonance frequency of the antenna,
    wherein the impedance switching circuit includes a protection resistor coupled in parallel to an impedance switch, and
    wherein the impedance switching circuit is employable with the antenna to determine the resonance frequency of the antenna during the high impedance state.

14. The NMR transceiver as recited in claim 13 wherein the receive circuit further includes an interface circuit that couples the LNA to the antenna during the receive mode and the calibration mode of the NMR transceiver.

15. The NMR transceiver as recited in claim 13, wherein the antenna receives echo signals from the excitation pulses during the receive mode of the NMR transceiver.

16. The NMR transceiver as recited in claim 13, further comprising a controller configured to generate control signals to operate the NMR transceiver in the calibration mode, the receive mode and a transmit mode.

17. The NMR transceiver as recited in claim 13, wherein said impedance switching circuit is coupled between a shorting capacitor of the LNA and ground.

18. The NMR transceiver as recited in claim 13, wherein an operating range of the NMR transceiver is between 400 kHz and 2 MHz.

* * * * *